(12) United States Patent
Lahoda et al.

(10) Patent No.: US 10,446,276 B2
(45) Date of Patent: Oct. 15, 2019

(54) METHOD OF MANUFACTURING A SIC COMPOSITE FUEL CLADDING WITH INNER ZR ALLOY LINER

(71) Applicant: WESTINGHOUSE ELECTRIC COMPANY LLC, Cranberry Township, PA (US)

(72) Inventors: Edward J. Lahoda, Edgewood, PA (US); Peng Xu, Columbia, SC (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 751 days.

(21) Appl. No.: 15/187,985

(22) Filed: Jun. 21, 2016

(65) Prior Publication Data

US 2017/0365364 A1    Dec. 21, 2017

(51) Int. Cl.
*C23C 16/32* (2006.01)
*G21C 3/07* (2006.01)
(Continued)

(52) U.S. Cl.
CPC .............. *G21C 3/07* (2013.01); *C04B 35/565* (2013.01); *C04B 35/6263* (2013.01);
(Continued)

(58) Field of Classification Search
None
See application file for complete search history.

(56) References Cited

U.S. PATENT DOCUMENTS 3,427,222 A    2/1969  Biancheria et al.
4,649,023 A    3/1987  Sabol et al.
(Continued)

FOREIGN PATENT DOCUMENTS

JP    2016013951 A    1/2016
JP    2016016603 A    2/2016
(Continued)

OTHER PUBLICATIONS

J. Binner et al. Microwave heated chemical vapor infiltration of SiC powder impregnated SiC fibre preforms; Advances in Applied Ceramics, vol. 112, No. 4 (2013) 235-241.*
(Continued)

*Primary Examiner* — David P Turocy
(74) *Attorney, Agent, or Firm* — Eckert Seamans Cherin & Mellott, LLC

(57) ABSTRACT

A method for making a fuel rod cladding tube and a cladding tube are described. The method includes wrapping ceramic fibers, for example, SiC fibers in a SiC matrix, around a tube formed from a metal alloy, such as a zirconium alloy. The interstices of the SiC wrappings on the tube are at least partially filled with SiC nano-sized particles. The surface of the filled tube is exposed by atomic layer deposition, at temperatures ranging from 25° C. to 600° C., to at least one cycle of alternating, non-overlapping pulses of gaseous precursors containing carbon and silicon to form a SiC monolayer. The step of filling the interstices of the SiC wrappings on the tube with SiC nano-sized particles fills large voids in the SiC wrapping. The step of exposing the surface of the particle filled SiC windings to at least one cycle of gaseous pulses fills small voids in the SiC wrapping.

11 Claims, 1 Drawing Sheet

(51) Int. Cl.
  *C04B 35/80*  (2006.01)
  *G21C 21/02*  (2006.01)
  *C04B 35/565*  (2006.01)
  *C04B 35/626*  (2006.01)

(52) U.S. Cl.
  CPC ........ *C04B 35/6264* (2013.01); *C04B 35/806* (2013.01); *C23C 16/325* (2013.01); *G21C 21/02* (2013.01); *C04B 2235/3826* (2013.01); *C04B 2235/5244* (2013.01); *C04B 2235/5445* (2013.01); *C04B 2235/5454* (2013.01); *C04B 2235/614* (2013.01); *C04B 2235/616* (2013.01); *C04B 2235/72* (2013.01); *C04B 2235/77* (2013.01); *C04B 2235/79* (2013.01); *Y02E 30/40* (2013.01)

(56) References Cited

U.S. PATENT DOCUMENTS

| | | | |
|---|---|---|---|
| 5,075,075 | A | 12/1991 | Kapil |
| 5,112,573 | A | 5/1992 | Foster et al. |
| 5,182,077 | A | 1/1993 | Feinroth |
| 5,230,758 | A * | 7/1993 | Foster ............... C22C 16/00 148/672 |
| 5,338,576 | A | 8/1994 | Hanzawa et al. |
| 5,391,428 | A | 2/1995 | Zender |
| 6,246,740 | B1 | 6/2001 | Maruyama et al. |
| 7,139,360 | B2 | 11/2006 | Lahoda |
| 2003/0008067 | A1 * | 1/2003 | Yamaguchi ......... C04B 35/571 427/249.15 |
| 2006/0039524 | A1 | 2/2006 | Feinroth et al. |
| 2007/0189952 | A1 | 8/2007 | Easler et al. |
| 2012/0087457 | A1 * | 4/2012 | Garnier ............. C04B 35/565 376/416 |
| 2014/0079879 | A1 | 3/2014 | Takagi |
| 2015/0063521 | A1 * | 3/2015 | Yacout ............. G21C 21/02 376/414 |
| 2015/0078505 | A1 | 3/2015 | Ku et al. |
| 2015/0348652 | A1 | 12/2015 | Mazzoccoli et al. |

FOREIGN PATENT DOCUMENTS

| | | | |
|---|---|---|---|
| WO | WO2012048071 | A1 | 4/2012 |
| WO | WO2015/175035 | A2 | 11/2015 |
| WO | WO-2015175035 | A2 * | 11/2015 ............... G21C 3/07 |

OTHER PUBLICATIONS

E. Alat, et al.; Ceramic coating for corrosion (c3) resistance of nuclear fuel cladding; Surface and Coatings Technology 281 (2015) 133-143; Sep. 14, 2015; Elsevier.

Y. Katoh, et al.; Continuous SiC fiber, CVI SiC matrix composites for nuclear applications: Properties and irradiation effects; Journal of Nuclear Materials 448 (2014) 448-476; Jul. 1, 2013; Elsevier.

P. Yonathan, et al. Improvement of SiCf/SiC density by slurry infiltration and tape stacking; Materials Research Bulletin 44 (2009) 2116-2122; Jul. 15, 2009; Elsevier.

J. Binner et al.; Microwave heated chemical vapour infiltration of SiC powder impregnated SiC fibre preforms; Advances in Applied Ceramics, vol. 112, No. 4 (2013) 235-241.

Steven M. George; Atomic Layer Deposition: An Overview; Chem. Rev. 2010;, vol. 110, pp. 111-131 (2010); Published on Web Nov. 30, 2009.

D. L. Chandler; Improved nuclear fuel-rod cladding might prevent future Fukushimas A substitute for traditional zircaloy could greatly reduce the danger of hydrogen explosions; MIT News; Massachusetts Institute of Technology, Cambridge, MA 02139-4307; Jul. 26, 2013; http://news.mit.edu/2013/better-cladding-for-nuclear-reactors.

* cited by examiner

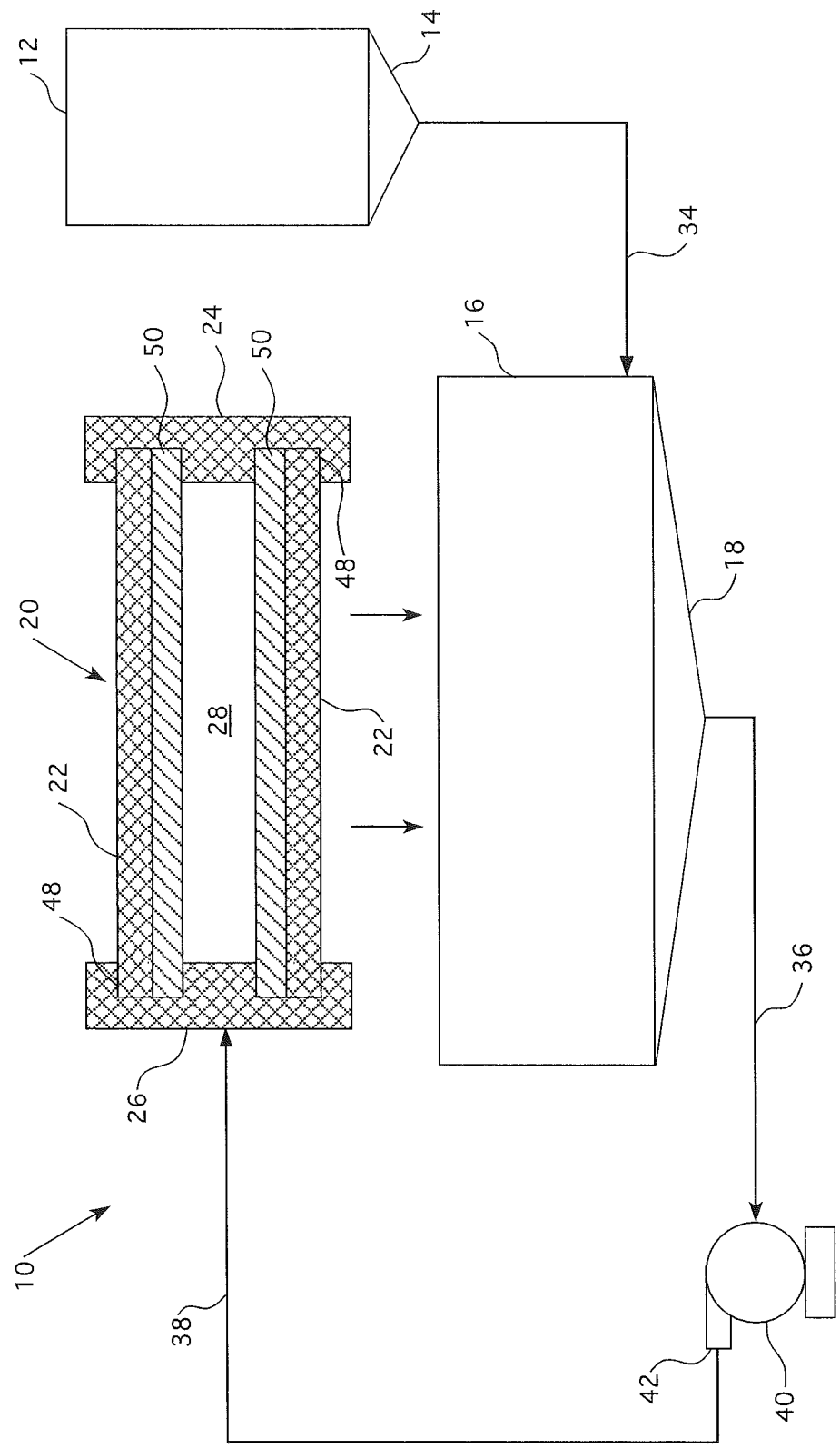

METHOD OF MANUFACTURING A SIC COMPOSITE FUEL CLADDING WITH INNER ZR ALLOY LINER

BACKGROUND

1. Field

The invention relates to methods of manufacturing a hybrid nuclear fuel cladding having an inner metal alloy tube covered with a ceramic fiber matrix, and in particular, a method for filling pores remaining in the covered cladding to improve operating performance and accident tolerance.

2. Description of the Related Art

In a typical nuclear reactor, the reactor core includes a large number of fuel assemblies, each of which is composed of a plurality of elongated fuel rods or similar elements. Although fuel assemblies vary in size and design depending on a number of factors, it is the fuel rods that house the fuel fissile material, such as at least one of uranium dioxide ($UO_2$), plutonium dioxide ($PuO_2$), uranium nitride (UN), and/or uranium silicide ($U_3Si_2$), with possible additions of boron, gadolinium or compounds thereof, and the like. Fuel rods are encased in a cladding that acts as a containment for the fissile material. In a reactor, fuel rods are grouped together in an array which is organized to provide a neutron flux in the core sufficient to support a high rate of nuclear fission and the release of a large amount of energy in the form of heat. A coolant, such as water, is pumped through the core to extract the heat for useful work.

The cladding on the fuel rods may be composed of zirconium (Zr) and may include a small amount (up to two percent by weight) of other metals such as niobium (Nb), tin (Sn), iron (Fe) and chromium (Cr). Zirconium alloys offer a low neutron absorption cross section, resistance to high temperature steam corrosion, good thermal conductivity and good mechanical properties, but are subject to exterior corrosion from exposure to the coolant water. Exemplary Zr alloys are disclosed in U.S. Pat. Nos. 3,427,222; 5,075,075; and 7,139,360.

Fuel rod cladding has therefore been coated with materials to prevent exterior corrosion. Ceramic-containing coating materials, such as silicon carbide (SiC), have been shown to have desirable safety properties. Experimental ceramic type materials such as SiC monolith, fibers and their combinations are taught in U.S. Pat. Nos. 6,246,740; 5,391,428; 5,338,576; 5,182,077, and U.S. Pat. Application Publications 2006/0039524, 2007/0189952; and 2015/0078505, the relevant portions of which are incorporated herein by reference. However, prior attempts to wrap a Zr alloy tube with SiC fibers has failed due to corrosion encountered during the chemical vapor infiltration process used to deposit SiC onto the SiC fiber wrapped Zr alloy tubing. One solution to avoid corrosion of the Zr alloy tubes, described in co-pending application PCT/US2015/015351, incorporated herein by reference, is to add an oxidation and corrosion resistant material as an intermediate coating layer. See also E. Alat et al., "Ceramic coating for corrosion (c3) resistance of nuclear fuel cladding," *Surface & Coating Technology*, vol. 281 (2015) pp. 133-143.

Because of the intense heat produced in a reactor core, and the even greater heat that can be produced in the event of an accidental loss of coolant where reactor temperatures can reach as high as 1204° C. (2,000° F.), the cladding has to perform well under extremely high temperature conditions. Although SiC ceramic composites wrapped around the Zr alloy tubes have been shown to improve safety, it has been found that the chemical vapor infiltration process for depositing SiC onto the Zr alloy tubes may be detrimental to the Zr alloy cladding, undermining the expected improvements from the SiC fiber wrapping.

SUMMARY OF THE INVENTION

The method described herein addresses the detrimental effects of the previously taught vaporization processes on metal tubing, and in particular on Zr alloy tubes. The method includes generally, the following steps: wrapping a metal alloy tube with a ceramic fiber material, filling large voids formed by the ceramic wrapping with a nano-powder form of the ceramic material, and subjecting the wrapped tube to atomic layer deposition to form at least one, and preferably multiple, thin layers of a SiC film to fill small voids in the ceramic wrapping.

In various aspects, the method for making a fuel rod cladding tube comprises wrapping SiC fibers around a tube formed from a metal, preferably a metal alloy, and most preferably a zirconium alloy, filling interstices of the SiC fibers with SiC nano-sized particles, and exposing the outer surface of the filled SiC fibers at a temperature between 25° C. to 600° C. to at least one cycle of alternating, non-overlapping pulses of gaseous precursors containing carbon iodine and silicon iodine to form a SiC monolayer, each cycle followed by a pulse of a carrier gas to remove iodine from the monolayer.

Multiple cycles may be used to form multiple monolayers until the film reaches a desired density depending on the particular requirements of the cladding tube environment. For example, the density may be 80% to 90% by volume, determined, for example, by a geometric density measurement, namely using the weight divided by the geometric volume. In various aspects, the temperature at which the gaseous pulses occur may range from 200° C. to 600° C., preferably 200° C. to 450° C., and more preferably from 265° C. to 350° C.

In various aspects, the SiC fibers used to wrap the tube are comprised of continuous tows of individual woven SiC fibers. Wrapping may be done, for example, by winding the fibers circumferentially around the exterior of the tube or by braiding the fibers around the tube.

The step in the method described herein of filling the interstices of the SiC fiber wrappings with SiC nano-sized particles may comprise infiltrating the wrapped tube with a slurry containing SiC nano-powder. In various aspects, the slurry may be an aqueous slurry. In various aspects, the slurry may be formed by dispersing the nano-sized particles in a solvent, which may, for example, be selected from one or more of the following: triethylamine, ethanol, methanol, and water. A dispersant may be added to the slurry. Suitable dispersants may include an acrylic polymer, a methacrylic polymer, a styrene-acrylic polymer, or any other suitable dispersant known in the art.

In aspects of the method described herein that include adding the nano-sized particles to a slurry, the slurry may comprise, for example, from 5% to 30% by volume SiC particles having an average particle size distribution from 10 nm to 1 micron. In aspects of the method wherein the nano-sized particles are in a solvent, particularly but not necessarily a solvent other than water, the slurry may comprise, for example, 5% or more by volume SiC particles having an average particle size distribution from 10 nm to 1000 nm. In aspects of the method wherein the nano-sized particles are in an aqueous slurry, the slurry may comprise 20% to 30% by volume SiC particles having an average particle size distribution from 10 nm to 1 micron.

The step of filling the interstices of the SiC wrappings with SiC nano-sized particles fills large voids in the fiber windings, which are defined herein to mean areas within and between the SiC fiber tows and wrappings where the largest cross-sectional dimension of an area is greater than or equal to two microns. The step of exposing the surface of the filled SiC wrappings to at least one cycle of gaseous pulses fills small voids in the SiC wrapping on the tube with SiC particles, which are defined herein to mean areas within and between the SiC fiber tows and wrappings, where the largest cross-sectional dimension of an area is less than two microns in diameter.

The problems experienced with conventional Zr alloy tubes are overcome by a fuel rod cladding tube as described herein that is comprised of a zirconium alloy tube wrapped with ceramic fibers, preferably SiC fibers, and having at least one SiC film layer deposited thereon. Large voids in the SiC wrapping are filled with SiC nano-sized particles having an average size distribution from 10 nm to 1 micron and small voids in the wrapped tube are filled with the at least one SiC film layer.

In various embodiments, the zirconium alloy used to form the cladding tube may include, by weight %, 0.5-2.0 niobium, 0.7-1.5 tin, 0.07-0.14 iron, and 0.03-0.14 of at least one of nickel and chromium, and at least 0.12 total of iron, nickel and chromium, and up to 220 ppm C, and the balance essentially zirconium. In various aspects, the zirconium alloy may include by weight %, 0.03-0.08 chromium and 0.03-0.08 nickel. The SiC tows wrapped around the tube may be comprised of continuous SiC fibers with low (<1% oxygen content and Si/C ratios of 0.95 to 1.01)-reinforced SiC matrix composites It should be understood that this disclosure is not limited to the embodiments disclosed in this Summary, and it is intended to cover modifications that are within the spirit and scope of the invention, as defined by the claims.

BRIEF DESCRIPTION OF THE DRAWINGS

The characteristics and advantages of the present disclosure may be better understood by reference to the accompanying FIGURES.

FIG. 1 is a schematic illustration of an exemplary embodiment of an assembly used in the portion of the method described herein for depositing a nano-powder, delivered in this embodiment in the form of a slurry, to fill the interstices in the SiC fiber wrappings on the outside of the fuel rod cladding tubes.

DETAILED DESCRIPTION

As used herein, the singular form of "a", "an", and "the" include the plural references unless the context clearly dictates otherwise. Thus, the articles "a" and "an" are used herein to refer to one or to more than one (i.e., to at least one) of the grammatical object of the article. By way of example, "an element" means one element or more than one element.

Directional phrases used herein, such as, for example and without limitation, top, bottom, left, right, lower, upper, front, back, and variations thereof, shall relate to the orientation of the elements shown in the accompanying drawing and are not limiting upon the claims unless otherwise expressly stated.

In the present application, including the claims, other than where otherwise indicated, all numbers expressing quantities, values or characteristics are to be understood as being modified in all instances by the term "about." Thus, numbers may be read as if preceded by the word "about" even though the term "about" may not expressly appear with the number. Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Further, any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

The term "thin film" as used herein refers to a layer of material ranging from fractions of a nanometer (e.g., a monolayer) to several micrometers in thickness.

The term "ceramic composite" as used herein refers to various ceramic composite materials, such as alumina ($Al_2O_3$) and alumina fibers in an alumina matrix, silicon carbide (SiC) and SiC fibers, and may preferably refer to SiC monolith, SiC fibers, and their combinations, multiple layers of SiC materials, including dense monolithic SiC, SiC—SiC composite, SiC fiber reinforced composites, such as one or more, preferably two or three, layers of high purity beta or alpha phase stoichiometric SiC covered by a central composite layer of continuous beta phase stoichiometric SiC fibers infiltrated with beta phase SiC and, in the case of three layered embodiments, an outer protective layer of fine grained beta phase SiC. In various aspects, a ceramic composite may comprise a SiC continuous fiber-reinforced, SiC matrix composites (SiC/SiC composites) consisting of near stoichiometric SiC fibers, stoichiometric and fully crystalline SiC matrices, and pyrocarbon or multilayered pyrocarbon/SiC interphase between the fiber and the matrix.

The term "void" or "voids", "pore" or "pores" or "interstices" of the SiC wrappings or SiC windings refers to the open or unoccupied areas within and between the SiC fibers and fiber tows and the SiC fiber wrappings around the cladding tube. The voids will necessarily be inconsistent in shape and size and will have for the most part, irregular shapes. Large void, pores, or interstices, in this context, means those areas of two microns or more at their longest dimension. Small voids, pores, or interstices in this context, means those areas of less than two microns at their longest dimension.

An improved cladding and method for making an improved cladding are described. In various aspects of the method, a metal tube, preferably a metal alloy tube determined to have physical properties appropriate for use in environments such as that of a nuclear reactor, and more particularly appropriate for use as a fuel rod cladding tube of a nuclear reactor, is provided. The metal alloy tube in various embodiments is a zirconium alloy tube. Those skilled in the art will appreciate that the "tube" may be circular or non-circular in cross-section and as such, the term "tube" should not be construed as limited to a cylinder. In various aspects, the tube walls may be relatively thin, about 0.1 to 2 millimeters thick.

In various aspects, the zirconium alloy may be coated ZIRLO™, made in accordance with the procedures disclosed in U.S. Pat. No. 4,649,023, incorporated in relevant part herein by reference. ZIRLO™ is an alloy comprising, by weight percent, 0.5-2.0 niobium, 0.7-1.5 tin, 0.07-0.14 iron, and 0.03-0.14 of at least one of nickel and chromium, and at least 0.12 total of iron, nickel and chromium, and up to 220 ppm C, and the balance essentially zirconium. Preferably, the alloy contains 0.03-0.08 chromium, and 0.03-0.08 nickel. Those skilled in the art will appreciate that other zirconium alloys, stainless steel alloys or metal alloys found to be acceptable for use in a desired application may be used in place of the specific alloy described herein.

In certain aspects, when the tube is formed from a zirconium alloy, the alloy is subjected to intermediate recrystallization anneals at a temperature of about 1,200°-1,300° F. (649° C.-704° C.), and to a beta quench. In one aspect, the coated zirconium alloy may be made in accordance with the procedure disclosed in U.S. Pat. No. 5,112,573, incorporated in relevant part herein by reference. The coating can be chromium, as disclosed in U.S. Patent Application Publication US 2015/0348652, incorporated in relevant part herein by reference, or a $Ti_xAl_{1-x}N/TiN$ multilayer, as disclosed in E. Alat et al., "Ceramic coating for corrosion (c3) resistance of nuclear fuel cladding," *Surface & Coatings Technology*, v. 281, pp. 133-143 (2015), wherein x is approximately 0.54 to 0.67.

In certain aspects, the coated zirconium alloy has a coating which may be selected from the group consisting of Cr, $Ti_2AlC$, TiN/TiAlN, FeCrAl, FeCrAlY, and other coatings compounds known to those skilled in the art to be suitable for coating alloys appropriate to the desired end use of the tube. The zirconium alloy may have the same chemical composition but will be heat treated differently from ZIRLO™. The zirconium alloy can be either fully recrystallized or partially recrystallized. The zirconium alloy will have more ductility than standard ZIRLO™.

The tube is wrapped with ceramic fiber tows by braiding or by winding the fiber tows circumferentially about the tube. Braiding and winding techniques are well known to those skilled in this and other areas of endeavor. The fiber, in various aspects, may be SiC fiber tows, and preferably, is a SiC ceramic with low oxygen and a near stoichiometric ratio of Si/C. The SiC composite formed on the outside of the tube may comprise continuous SiC fiber-reinforced SiC matrix composites, as disclosed in U.S. Patent Application Publication 2015/0078505 or Y. Katoh et al., "Continuous SiC fiber, CVI SiC matrix composites for nuclear applications: Properties and irradiation effects," *Journal of Nuclear Materials*, vol. 448, pp. 448-476 (2014). The type of SiC fibers to be used in the method described herein may, for example, be either Hi-Nicalon™ Type S fibers (manufactured by Nippon Carbon, Tokyo, Japan) or Tyranno™ SA3 fibers (manufactured by Ube Industry, Ube, Japan) listed in Table 1 of Y. Katoh et al., *Journal of Nuclear Materials*, vol. 448 at 450.

The SiC wrappings, whether by braiding or winding, may have a thickness comparable to the thickness of the tube being wrapped. In exemplary embodiments, the wrappings may be from 0.1 to 2 mm thick. In certain embodiments, the SiC may be wrapped to a thickness of about 0.4 mm.

After the tube is wrapped with the SiC fibers to form a matrix, the interstices of the SiC matrix are filled with a ceramic powder, such as a SiC nano-particles, or nano-powder, in dry form. Alternatively, the interstices of the SiC fiber matrix may be infiltrated with a slurry containing SiC nano-particles. Several methods can be used to fill the pores with SiC nano powder.

In one exemplary method, electrophoretic deposition/impregnation (ED/I) was used. In an exemplary embodiment of this method, solvent based slurries, such as, but not limited to ethanol based slurries, containing solid loadings of 5 vol. % were prepared using the SiC powders having an average particle size distribution from 10 nm to 1000 nm. The powders were dispersed using 0.5 vol. % triethylamine (Ciba Specialty Chemicals, Bradford, UK). Other solvents, such as, but not limited to ethanol, methanol, and water can be used. To remove powder agglomerates during preparation, the slurries were exposed to ultrasonic energy at 23 kHz, using a Soniprep 150 Ultrasonicator, (MSE Scientific Instruments, Manchester, UK) for a minimum of 60 seconds together with mechanical agitation using a magnetic stirrer. A dispersant, such as, but not limited to, an acrylic polymer, a methacrylic polymer, or a styrene-acrylic polymer, each commercially available and sold by BASF under the trademark Glascol®, may be added to the slurry, in for example an amount of 100 ppm, to keep the particles in suspension. A detailed description of the ED/I process is described in J. Binner et al., "Microwave heated chemical vapour infiltration of SiC powder impregnated fibre preforms," *Advances in Applied Ceramics*, vol. 112, No. 4, pp 235-241 (2013).

In another method, a vacuum bagging process may be used to fill the interstices of the SiC fibers and fiber matrix with the SiC nano-particles, using aqueous slurries containing solid loadings of either 20 or 30 vol. % and various sizes of SiC particles having an average particle size distribution from 10 nm to 1 micron. The powders were dispersed using 1-1.5 wt-% of Glascol® and the pH was controlled at 9.0+/−0.2 (e.g., pH 8.8 to 9.2) via the addition of ammonia solution. Solvents, such as ethanol, methanol, and water can be used in the slurry. Those skilled in the art will appreciate that there are other appropriate solvents and dispersants that can be substituted for the solvents and dispersants mentioned here. To eliminate powder agglomerates, the slurries can be ball milled in airtight polyethylene bottles using zirconia media for 24 hours. A detailed description of vacuum bagging is available in J. Binner et al., "Microwave heated chemical vapour infiltration of SiC powder impregnated fibre preforms," *Advances in Applied Ceramics*, vol. 112, No. 4, pp 0.235-241 (2013).

The step of filling the interstices within the SiC wrappings on the outside of the cladding tube with nano-particles of SiC may be performed using the assembly, or a similar assembly, shown in FIG. 1. Referring to FIG. 1, an assembly 10 is shown schematically. The assembly 10 includes a slurry feed tank 12 having a funnel portion 14 at the bottom connected via conduit 34 to a sump 16. The sump 16 also includes a funnel 18 at the bottom for gravity powered exit of the slurry through conduit 36 to slurry pump 40. The pump 40 pumps the slurry through pump exit 42 along conduit 38 back to the slurry tank 16 to keep solids suspended. Tube 20 is comprised of a metal tube 50 with a surrounding ceramic matrix 22 of wound or braided ceramic fibers. The ends are closed with end caps 24 and 26 which are seated in annulus or cap inset 48 so as to preclude infiltration of the slurry into the inside 28 of the tube.

Slurry from the slurry feed tank 12 is used to fill the sump 16. The tube 20 is lowered into the sump 16 and the suspended particles are allowed to infiltrate into the braided or wound SiC fiber matrix. Pump 40 maintains circulation of the slurry through the sump 16 and together with any dispersant optionally present in the slurry maintains the particles in suspension. Pump 40 may be operated at a pressure sufficient to circulate the slurry. No particular additional force need be applied but electrophoretic deposition/impregnation or vacuum bagging methods have also been used. The current description discloses the simplest technique. The nano-particles will infiltrate the interstices within the fiber and the fiber wrappings by soaking. The tube 20 is then removed from the slurry. The step of filling the interstices of the SiC wrappings with SiC nano-sized particles fills large voids within the tube and ceramic fiber windings.

When the interstices of the SiC wrappings on the cladding tube are filled with SiC nano-particles using a slurry, the wrapped tube is preferably dried prior to advancing to the step of filling small voids. Any suitable known passive or active drying means will suffice.

To fill smaller pores, following the particle infiltration step, the surface of the SiC wrapping on the cladding tube is exposed, at a temperature between 25° C. to 600° C., to at least one cycle of alternating, non-overlapping pulses of gaseous precursors containing a carbon compound, such as carbon iodine, and a silicon compound, such as silicon iodine, to form a SiC monolayer. Each cycle is preferably followed by a pulse of carrier gas such as nitrogen, helium, argon or a similar gas to remove non-silicon carbide materials, such as iodine, from the monolayer. In various aspects of the method, the surface of the SiC wrapped tube may be exposed to a plurality of cycles to form multiple layers of SiC film, preferably until the density of the multiple layers reaches a desired level, such as a density of at least 80% by volume. The density may vary depending on the intended application and environment in which the finished tube will be used.

The step of exposing the surface to the gaseous pulses is preferably accomplished using an atomic layer deposition (ALD) process. ALD is a coating deposition technique that is based on the sequential use of a gas phase chemical process. The majority of ALD reactions use two chemicals, called precursors. These precursors react with the surface of a material one at a time in a sequential, self-limiting, manner. Through the repeated exposure to separate precursors, a thin film is slowly deposited. The precursors chosen for the SiC deposition may contain silicon iodine, carbon iodine, and a carrier gas (for taking away the iodine from the monolayer deposited after each cycle). The temperature used in the deposition may range from 25° C. to 600° C., preferably from 200° C. to 450° C., and more preferably from 265° C. to 350° C., or other temperatures with any of the foregoing ranges. In a test run, the temperature was 265° C. Temperatures greater than 600° C. should be avoided The method described herein solves a significant problem in conventional cladding methods. The method also solves problems heretofore experienced with conventional ALD processes being too slow to fill all of the pores in a SiC composite. The SiC nano-powder and the infiltration process prior to use of the ALD process significantly reduce the time needed to fill all voids and thus the time to make the cladding as a whole. Further, the reduced time reduces the cost of manufacturing the cladding tubes. It has been found that use of ALD alone can only fill pores of 1-2 microns after a week or more of layering. The method described herein reduces the time for the entire cladding process to three days and results in effectively all, if not all, pores or voids being filled, thereby protecting the Zr alloy and preventing the corrosion heretofore experienced with Zr alloy cladding.

The method described herein improves the high temperature strength of Zr alloy cladding. The method makes it possible to successfully use a covering of SiC composite on current Zr cladding with significant improvement in accident tolerance to prevent, or at least significantly reduce the risk of, accidents, such as loss of coolant events similar to that at the Fukushima Daiichi Japanese nuclear power plant in the aftermath of the earthquake and tsunami in 2011. The hybrid cladding described herein allows use of U3Si2 fuel which provides better fuel cycle economics.

The method described herein produces, in various aspects, a fuel rod cladding tube comprised of a zirconium alloy tube wrapped with SiC fibers and having at least one SiC film layer deposited thereon, wherein large pores in the SiC fiber wrapped tube are filled with SiC nano-sized particles having an average size distribution from 10 nm to 1 micron and small pores in the SiC fiber wrapped tube are filled with the at least one SiC film layer. As described herein, the zirconium alloy may be comprised of, by weight %, 0.5-2.0 niobium, 0.7-1.5 tin, 0.07-0.14 iron, and 0.03-0.14 of at least one of nickel and chromium, and at least 0.12 total of iron, nickel and chromium, and up to 220 ppm C, and the balance essentially zirconium. The zirconium alloy may include, for example, by weight %, 0.03-0.08 chromium and 0.03-0.08 nickel. Those skilled in the art will appreciate that other zirconium alloys, stainless steel alloys or metal alloys found to be acceptable for use in a desired application may be used in place of the specific alloy described herein. In various aspects, the zirconium tube walls may be relatively thin, about 0.1 to 2 millimeters thick. The SiC wrappings may be of a comparable thickness. In an exemplary embodiment, the outer diameter of a finished cladding tube is about 9.5 mm with a tube thickness of about 0.3 mm and a SiC fiber wrapping thickness of about 0.4 mm.

The SiC fibers of the composite surrounding the metal tube as described in various aspects herein, may be continuous SiC fiber-tows of SiC fibers. The SiC nano particles that fill the large pores of the tube in various aspects may be substantially pure SiC having less than one percent by weight of non-SiC impurities and having a stoichiometric molar ratio of Si/C of between 0.95 and 1.01.

The present invention has been described in accordance with several examples, which are intended to be illustrative in all aspects rather than restrictive. Thus, the present invention is capable of many variations in detailed implementation, which may be derived from the description contained herein by a person of ordinary skill in the art.

All patents, patent applications, publications, or other disclosure material mentioned herein, are hereby incorporated by reference in their entirety as if each individual reference was expressly incorporated by reference respectively. All references, and any material, or portion thereof, that are said to be incorporated by reference herein are incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative embodiments. The embodiments described herein are understood as providing illustrative features of varying detail of various embodiments of the disclosed invention; and therefore, unless otherwise specified, it is to be understood that, to the extent possible, one or more features, elements, components, constituents, ingredients, structures, modules, and/or aspects of the disclosed embodiments may be combined, separated, interchanged, and/or rearranged with or relative to one or more other features, elements, components, constituents, ingredients, structures, modules, and/or aspects of the disclosed embodiments without departing from the scope of the disclosed invention. Accordingly, it will be recognized by persons having ordinary skill in the art that various substitutions, modifications or combinations of any of the exemplary embodiments may be made without departing from the scope of the invention. In addition, persons skilled in the art will recognize, or be able to ascertain using no more than routine experimentation, many equivalents to the various embodiments of the invention described herein upon review of this specification. Thus, the invention is not limited by the description of the various embodiments, but rather by the claims.

The invention claimed is:

1. A method for making a fuel rod cladding tube comprising:
   wrapping SiC fibers around a metal alloy tube;
   filling the interstices of the SiC fiber wrappings with SiC nano-sized particles; and,
   exposing the surface of the SiC wrapped tube at a temperature between 25° C. to 600° C. to at least one cycle of alternating, non-overlapping pulses of gaseous precursors containing a carbon compound and a silicon compound to form a SiC monolayer, each cycle followed by a pulse of a carrier gas to remove non-silicon and carbon constituents from the monolayer,
   wherein the gaseous precursors are carbon iodine and silicon iodine, and the carrier gas removes iodine constituents from the monolayer.

2. The method recited in claim 1 wherein the filling step comprises infiltrating the SiC fiber wrappings with a slurry containing SiC nano-powder.

3. The method recited in claim 2 wherein following the step of infiltrating the SiC fiber wrappings, the tube is dried before the step of exposing the surface of the SiC wrapped tube to gaseous pulses.

4. The method recited in claim 2 wherein the slurry is an aqueous slurry.

5. The method recited in claim 4 wherein the aqueous slurry comprises 20 to 30% by volume SiC particles having an average particle size distribution from 10 nm to 1 micron.

6. The method recited in claim 5 wherein the pH of the aqueous slurry ranges from 8.8 to 9.2.

7. The method recited in claim 2 wherein the slurry comprises SiC nano powder in a solvent.

8. The method recited in claim 7 wherein the solvent is selected from the group consisting of triethylamine, ethanol, methanol, and water.

9. The method recited in claim 7 wherein the slurry comprises at least 5% by volume SiC particles having an average particle size distribution from 10 nm to 1000 nm.

10. The method recited in claim 1 wherein the surface of the SiC wrapped tube is exposed to a plurality of cycles to form multiple layers of SiC film.

11. The method recited in claim 1 wherein filling the interstices of the SiC fiber wrappings with SiC nano-sized particles fills large pores having a largest dimension of two microns and above, and exposing the surface of the SiC wrapped tube to pulses of gaseous precursors fills small pores having a largest dimension of less than two microns in the ceramic wrapping.

* * * * *